United States Patent [19]

Hendricks et al.

[11] Patent Number: 4,785,235
[45] Date of Patent: Nov. 15, 1988

[54] SHORTS TESTING TECHNIQUE REDUCING PHANTOM SHORTS PROBLEMS

[75] Inventors: T. Michael Hendricks, Loveland, Colo.; William A. Groves, San Jose, Calif.

[73] Assignee: Hewlett-Packard Company, Palo Alto, Calif.

[21] Appl. No.: 169,157

[22] Filed: Mar. 8, 1988

Related U.S. Application Data

[63] Continuation of Ser. No. 563,349, Dec. 20, 1983, abandoned.

[51] Int. Cl.$^4$ ................... G01R 31/02; G01R 27/02
[52] U.S. Cl. ................... 324/73 PC; 324/62; 324/537
[58] Field of Search ............... 324/73 R, 73 PC, 66, 324/62, 57 R, 537, 538, 539, 549

[56] References Cited

U.S. PATENT DOCUMENTS

| | | | |
|---|---|---|---|
| 1,977,703 | 10/1934 | Swartwout | 324/73 R |
| 1,977,707 | 10/1934 | Weitzer | 324/73 R |
| 2,732,491 | 1/1956 | Jeannot | 324/73 R |
| 3,032,191 | 5/1962 | Clukey | 324/73 AT |
| 3,369,177 | 2/1968 | Graham et al. | 324/66 |
| 4,290,013 | 9/1981 | Thiel | 324/73 PC |
| 4,342,959 | 8/1982 | Skilling | 324/73 PC |

Primary Examiner—Ernest F. Karlsen
Attorney, Agent, or Firm—John A. Frazzini

[57] ABSTRACT

This shorts test method reduces the occurence of phantom shorts and also in those cases where phantom shorts occur, reduces the time required to eliminate the phantom shorts. When an unexpected open or short occurs or when an expected open or short does not occur, the test is repeated either until the phantom result ceases or until a sufficient time has elapsed that the result is real rather than a transient response. Test points are arranged in an order which decreases monotonically with the parallel impedance of all elements connected directly to that test point. This reduces the rate of occurance of phantom shorts caused by parallel inpedances below the shorts threshold even though none of the individual impedances is below the shorts threshold.

8 Claims, 4 Drawing Sheets

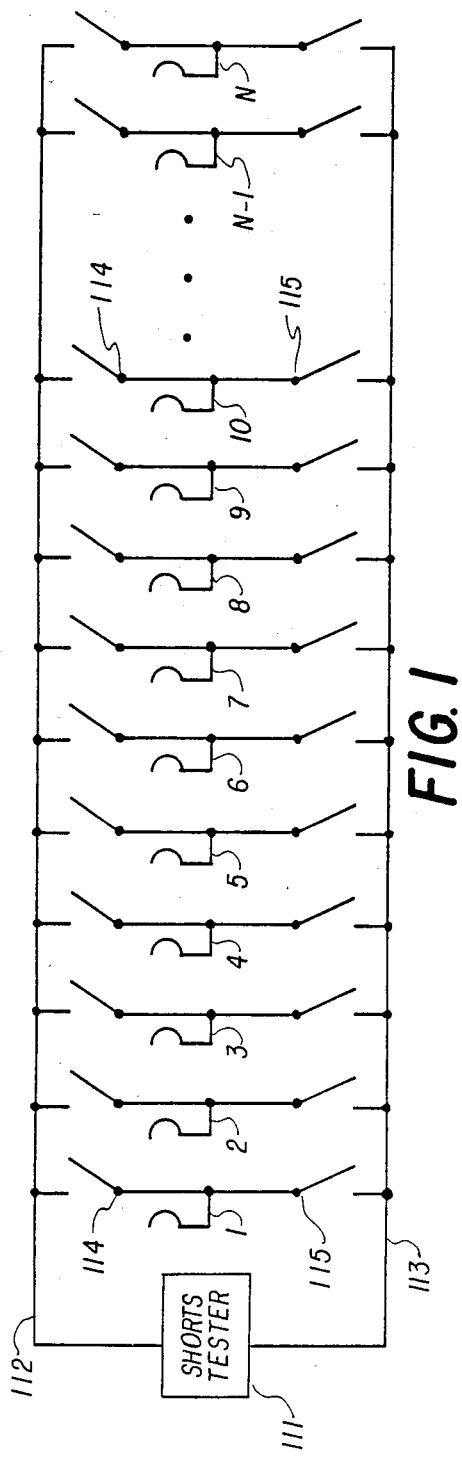
*FIG. 1*
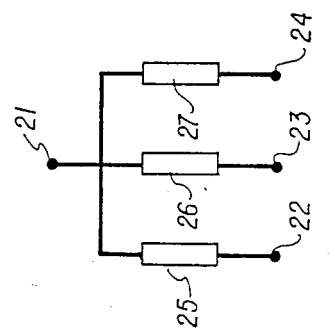
*FIG. 2*
| TEST PIN | PARALLEL IMPEDANCE | TEST POINT ORDER |
|---|---|---|
| 1 | 2R/3 | 1 |
| 2 | R/3 | 3 |
| 3 | R/3 | 4 |
| 4 | 2R/5 | 2 |
| 5 | 2R/7 | 5 |
*FIG. 5*

SHORTS TESTING TECHNIQUE REDUCING PHANTOM SHORTS PROBLEMS

CROSS REFERENCE TO RELATED APPLICATION

This application is a continuation, of application Ser. No. 563,349, filed Dec. 20, 1983, now abandoned.

BACKGROUND OF THE INVENTION

The disclosed invention relates in general to shorts testing and more particularly to phantom shorts problems arising in incircuit shorts testing. A short is defined to exist between a pair of test points if the impedance between those test points is less than some selected threshold value $Z_s$. Thus, an ohmmeter is conveniently utilized as a shorts tester.

In a device under test (DUT) having N test points, there are $N(N-1)/2$ different test point pairs any of which can be shorted to one another. One straightforward test technique is to test each of these pairs for a short. However, most DUTs have either no shorts or only a few shorts so that testing all possible pairs is inefficient. In one technique, the test points are ordered in a numerical sequence from 1 to N. A series of $N-1$ tests are performed as follows to determine if there are any shorts. In the kth of these tests for $k=1$ to $N-1$, test point k is connected to a first test lead A from the shorts tester and test points $k+1$ to N are connected to a second test lead B from the shorts tester. If no short is detected in the kth test, then it is known that the kth test point is not shorted to any other test point. Thus, it is determined in $N-1$ tests whether there are any shorts in the circuit.

If a short is detected, then it is often desired to identify the pairs that are shorted together in order to determine the cause of the short. If only the pth test above indicated the presence of a short, then only the pairs consisting of the pth test point and the qth test point for each $q>p$ need to be checked. Thus, for a typical DUT, much fewer than $N(N-1)/2$ pairs need to be tested to locate the shorts. A circuit tester suitable for implementing these tests is shown in FIG. 1. This circuit tester contains a set of N test pins 1 - N each of which is electrically connected to one of the N test points of the DUT. The tester can also have additional test pins not utilized in a shorts test of a given DUT. A shorts tester 111 has a first test lead 112 and a second test lead 113 and sets of switches 114 and 115 which controllably connect each of these test pins to either test lead.

In U.S. Pat. No. 4,290,013 entitled "Method of and Apparatus for Electrical Short Testing and the like", issued to David W. Thiel on Sept. 15, 1981, is shown another technique for locating shorts. In accordance with that technique, a set of M screening tests are performed (where M is the smallest integer equal to or greater than $\log_2 N$) to determine if there are any shorts and then, if there are some shorts, a set of search tests are performed to locate the shorts. In the screening tests, the test points are in effect numbered in order with a binary number. In the kth of these tests (for $k=1$ to M), all test points having an associated binary number having a 0 in the kth bit location are connected in parallel to one test lead and the other test points are connected to the other test lead. By this scheme, in at least one of these tests, every node pair will have been tested in at least one of the screening tests. Only those configurations corresponding to one of the screening tests for which a short is indicated are tested further to locate which particular pairs are shorted. For each configuration exhibiting a short, a binary search of the test points connected to test lead A is executed. Then, for each of those test points exhibiting a short, a further binary search is executed in which only that test point is connected to test lead A and the binary search is executed on the test points connected to test lead B.

When any shorts test sequence is implemented in an incircuit shorts tester, occasionally the screening tests will indicate the presence of at least one short which disappears during the search tests. These spurious shorts are known as phantom shorts. The way in which phantom shorts arise is illustrated in FIG. 2 which shows a set of test points 22-24 each connected by one of impedances 25-27, respectively, to a test point 21. If during a shorts test sequence, test point 21 is connected to test lead A and test points 22-24 are connected to test lead 24, then the parallel impedance of the parallel combination of impedances 25-27 will be produced between test lead A and test lead B. Whenever this parallel impedance is less than the threshold defining a short but none of the individual impedances is below that threshold, a short will be detected during the screening tests and will disappear during the search tests.

Phantom shorts produce two types of problems. If the DUTs are tested only to determine whether they have any shorts (i.e., only the screening tests are performed), then some DUTs will be discarded as ba which in fact do not have any shorts. If the additional search tests are performed to identify those test points that are shorted together, then no DUTs will be incorrectly discarded. However, the presence of the phantom shorts will increase the number of tests that need to be performed either to determine that the DUT has no shorts or to identify the locations of the shorts.

SUMMARY OF THE INVENTION

In accordance with the illustrated preferred embodiment, a technique is presented which reduces the problems encountered in shorts testing because of phantom shorts and opens. A shorts test sequence is executed to detect a DC short, but for tests of short duration, the circuit response may be dominated by transient responses due to capacitors and inductors. Such transient responses can produce phantom shorts and phantom opens. When a voltage is applied across an inductor, no current initially flows so that if the duration of a shorts test is short enough, an inductor will appear as an open. If the duration of the test is long enough to let the transient response die down, then the DC response will dominate and the inductor will appear as a DC short. Similarly, a capacitor looks like a short initially, but after the transient response has died down it will appear as a DC open. Therefore, to eliminate this type of phantom shorts and opens, each shorts test is controlled to be minimally long enough that the transient response has decreased sufficiently that it does not interfere with accurate shorts testing.

Another type of phantom short occurs whenever two or more impedances are connected in parallel between the two test leads of the shorts tester and produce a parallel impedance less than the threshold impedance defining a short even though none of the impedances individually is less than this threshold. Information about the topology of the circuit is utilized to order the test points in such a way that the incidence of phantom shorts is reduced. In a particular embodiment, for each test point, the parallel impedance of all of the impedances connected directly to that test point is calculated. The test points are then numbered in the order of the magnitude of their associated parallel impedances.

DESCRIPTION OF THE FIGURES

FIG. 1 shows an apparatus suitable for individually connecting each of a set of test pins to either of a pair of test leads from a shorts tester.

FIG. 2 illustrates how one type of phantom short arises.

FIG. 5 shows how test pins are ranked according to the parallel impedance of the DUT components directly connected to that test pin.

DESCRIPTION OF THE PREFERRED EMBODIMENT

Figure 3:
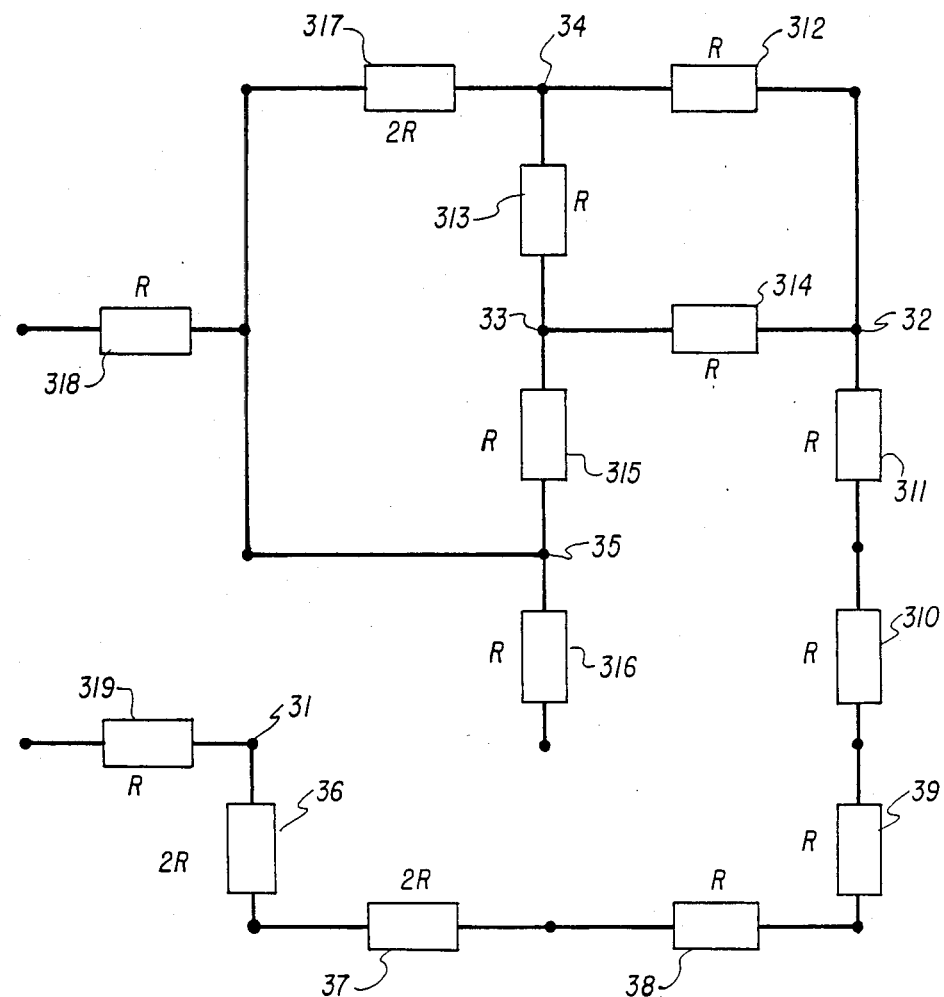
FIG. 3 shows a portion of a representative circuit for use in illustrating a shorts/opens test technique reducing problems due to phantom shorts and opens.

In FIG. 3 is shown a portion of a circuit of a representative device under test to illustrate a shorts test technique which reduces total test sequence duration required to locate all real shorts and eliminate all phantom shorts. In that portion of the circuit, a set of test points 31-35 are connected by a set of impedances 36-319. As shown there, it is not necessary to test the circuit at all of the nodes between impedances. The existence of a capacitive or inductive component in any of the impedances will produce a transient circuit response that can produce spurious results in a shorts test of too short a duration. A shorts test sequence is designed to locate DC shorts and therefore significant transient responses can produce phantom shorts or phantom opens which disappear if the duration of a test is long enough that transients decay sufficiently that they do not interfere significantly with test results.

In general, an inductor will appear initially to have infinite impedance (i.e., to be an open) even though its DC impedance is almost zero. Thus, if any of impedances 36-311 is an inductor, then a phantom open will result between test points 31 and 32 if the duration of the test is too short for this inductor's transient response to have died down sufficiently. Similarly, a capacitor will appear initially to have zero impedance (i.e., to be a short) even though its DC impedance is infinite. Thus, if impedance 314 is a capacitor then a phantom short will result between test points 32 and 33 if the duration is too short for this capacitor's transient response to have decreased sufficiently. The spurious shorts test results due to this transient behavior of inductive and capacitive elements are called transient opens and shorts. Since the transients have an exponential decay time, some transient response will be present no matter how long the duration of the test is. Therefore, the particular choice of minimum test duration is a function of how much transient interference with test results is considered tolerable. The existence of some transient response can be compensated for by reducing the shorts threshold $Z_s$ and increasing the opens threshold $Z_o$ by the maximum transient expected at the end of the minimum test duration. Unfortunately, the selected minimum duration is often longer than the time required for of a single shorts test so that extending each test to be at least as long as this minimum time will significantly decrease throughput.

Tests for opens are performed in a manner analogous to tests for shorts. In both cases, an ohmmeter is used to measure the impedance between test points. In a shorts test, a short is defined to occur if the measured impedance is below a shorts threshold value $Z_s$. In an opens test, an open is defined to occur if the measured impedance is above an opens threshold value $Z_o$. Since the DC impedance of an inductor and a capacitor are respectively essentially zero and infinity, the presence of such elements will show up as shorts and opens in a shorts test sequence. Thus, in general, a good DUT will exhibit some shorts and some opens. Therefore, a known good DUT is tested for shorts and opens to produce a reference list of those test pairs which should exhibit an open or a short. In testing a known good DUT to generate this list, each screening test and each search test is selected to be long enough that transient results are negligible.

Figure 4A:
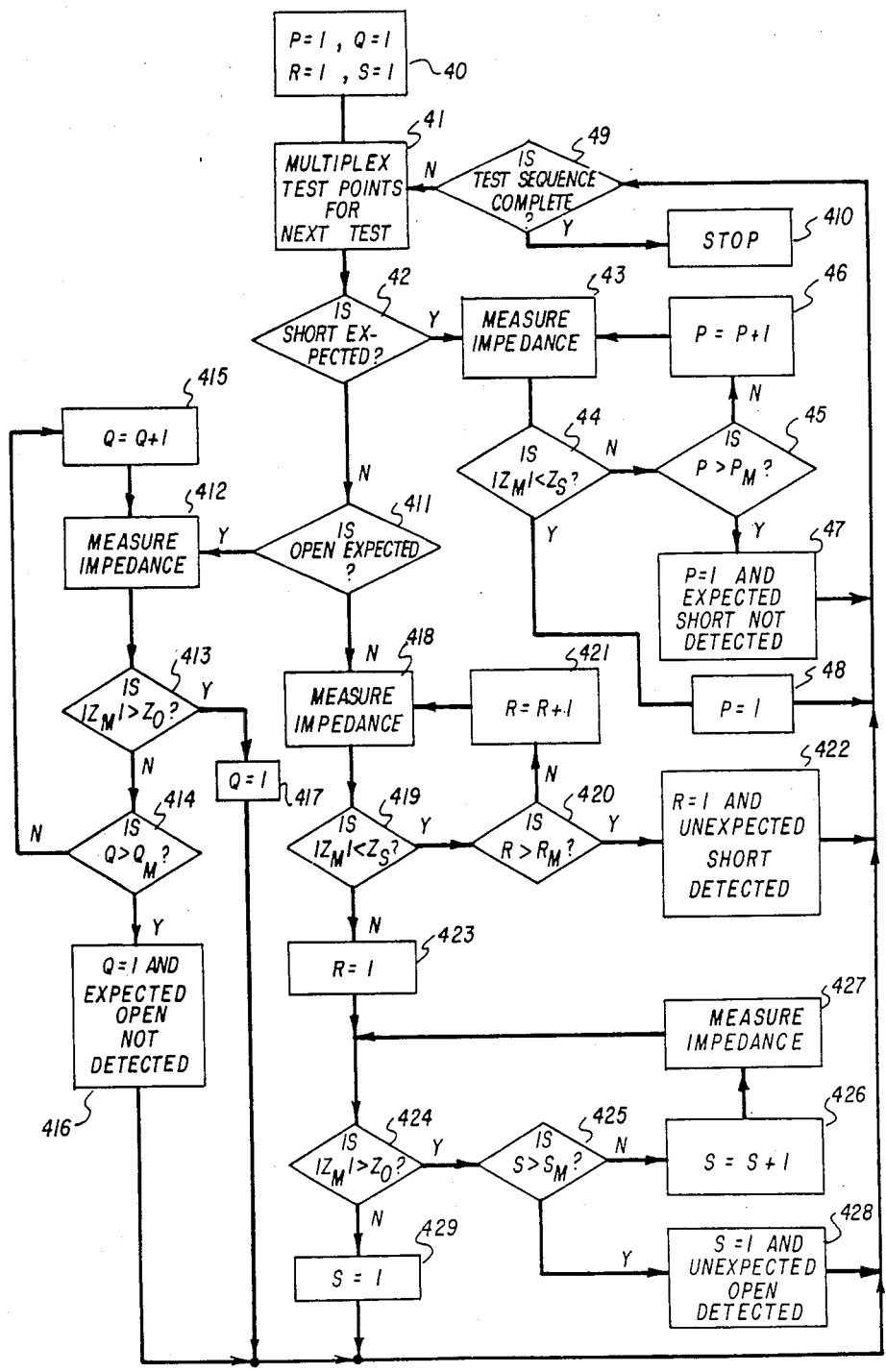
FIG. 4A is a flow diagram of the portion of the shorts/opens test technique directed to problems due to transient circuit response creating phantom shorts and opens.

The added test time required to eliminate transient effects in the test sequence of the known good DUT is not a significant problem because this test sequence need be performed only once for each type of circuit. However, in volume testing, it is disadvantageous to take that long for every test sequence. Therefore, these test sequences are performed in accordance with a test technique that uses in each individual test of a DUT the minimal time required to eliminate transient shorts and opns due to signal transients. In FIG. 4A is shown a flow diagram of a test technique which minimizes the time to eliminate these transient effects.

In an initial step 40, parameters P, Q, R and S are initialized. These parameters are used to control the maximum number of times a test is performed whenever an unexpected short or open occurs or whenever an expected short or open does not occur. The maximum number of test repetitions is selected to assure that transient response is not responsible for the unexpected results. In a first step 41, a multiplexer such as shown in FIG. 1 controllably connects a first set of test points to a first test lead 112 from a shorts tester 111 and connects a second set of test points to a second test lead 113 from shorts tester 111. In a second step 42, if a short is expected, a branch of the technique is taken using steps 43-47. In these steps, the impedance between the two test leads is measured and is compared with the threshold value defining the existence of a short. If, as expected, a short is detected, then a branch is taken to step 49 at which the test sequence is stopped (step 410) if the test sequence has been completed or if it has not been completed then step 41 is again executed to multiplex test points for the next test in the test sequence. If the expected short is not detected in steps 43 and 44, then loop 43-46 is repeated up to a maximum number of times $P_m$ until the expected short is detected. If the short is not detected after $P_m$ repetitions sufficient to let transients settle down, then an indication is created for the user to the effect that an expected short was not detected and step 49 is performed to determine whether the test sequence has been completed. A parameter P is utilized to keep track of how many test repetitions have occurred Steps 45 and 46 involve checking whether P is greater than $P_m$ and incrementing P by 1, respectively.

In each of steps 47 and 48, P is reset to 1 in preparation for a subsequent test for an expected short.

If no short is expected, then in step 42 a branch is taken to step 411. In step 411, if an open is expected, then steps 412–417, analogous to step 43–48, are utilized to check up to a maximum number of times $Q_m$ for an open. If an open is detected within that number of times, then step 49 is executed to determine whether the test sequence has been completed. If no open is detected within $Q_m$ repetitions, then an indication is made to the effect that an expected open was not detected and step 49 is executed. A parameter Q keeps track of the number of tests that have been performed for the expected open.

If in steps 42 and 411 it is determined that no shorts or opens are expected in this test set-up, then steps 418–429 are utilized to determine if any unexpected short or open is detected. Steps 418–423 check for an unexpected short and steps 424–429 check for an unexpected open. If an unexpected short is detected, then the test is repeated up to a maximum number of times $R_m$ and if an unexpected open is detected, then the test is repeated up to a maximum number of times $S_m$. The number of repetitions in each of these cases is sufficient to let transients settle down so that the conclusion that an unexpected short or open has been detected is not due to a transient short or open caused by transients. This repetitive testing whenever an expected short or open does not occur or whenever an unexpected short or open does occur enables the test to terminate at the first instance that the transient dies sufficiently to cease creating transient shorts or opens or else at a time sufficient to ensure that the unexpected result is real and is not due to transients. Therefore, this technique reduces the amount of time required to eliminate the spurious test results caused by transients.

Figure 4B:
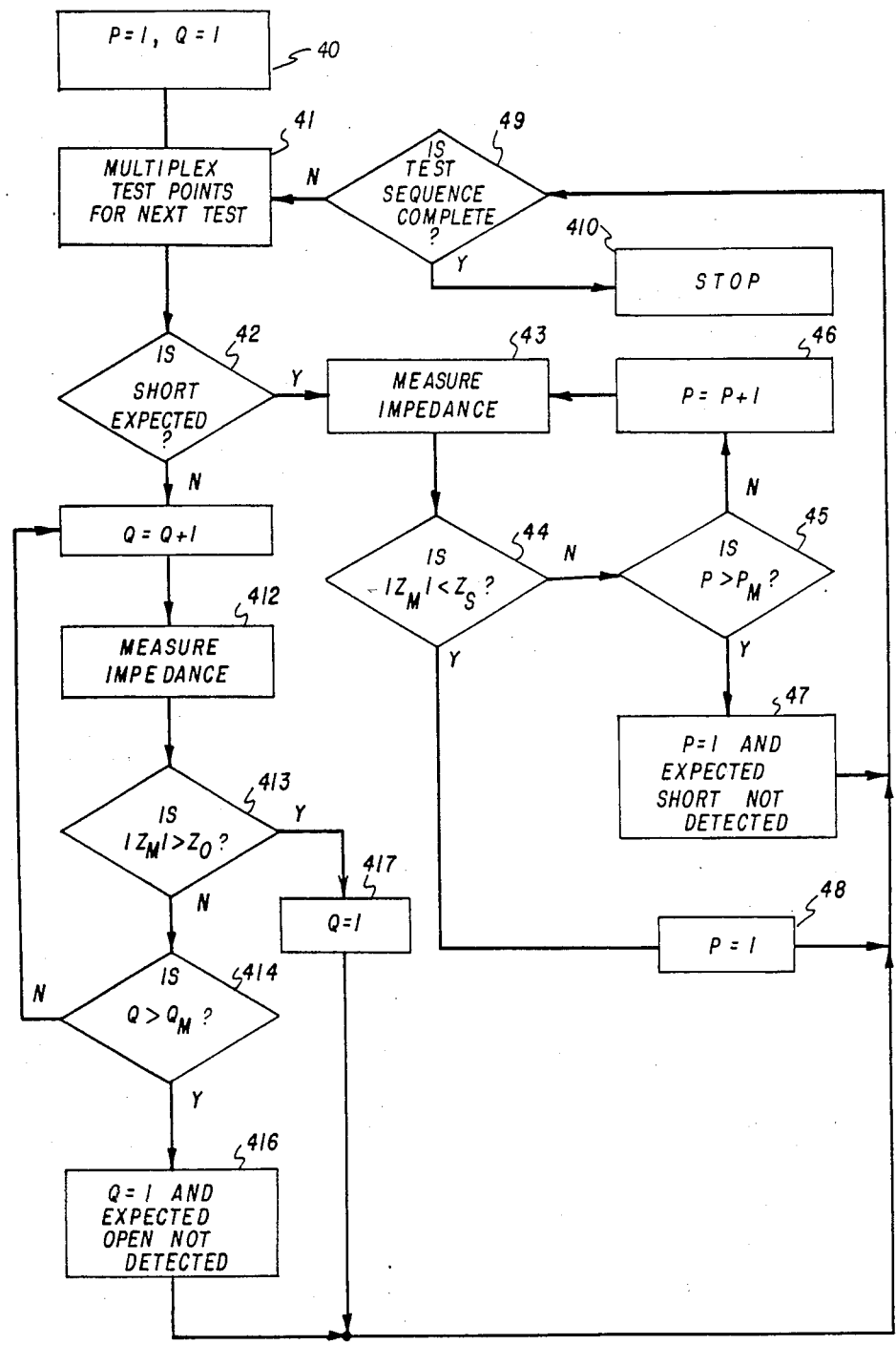
FIG. 4B is the simplified version of the flow diagram of FIG. 4A for the choice $Z_o = Z_s$.

In practice in a shorts tester, $Z_s$ is often selected to be equal to $Z_o$ so that only a single comparator is required to compare the measured impedance with the threshold impedance. For this choice, the flow diagram in FIG. 4A simplifies to that in FIG. 4B.

Phantom shorts can also arise in any test in which more than one test point is connected to either of the test leads. These transient shorts arise whenever the resulting parallel impedance created between the test leads is less than the threshold value defining a short even though none of the individual impedances is less than the threshold value. The amount of time required to eliminate such transient shorts is reduced by the following technique which is illustrated by reference to FIG. 3.

In FIG. 3, five test points 31–35 and fourteen impedances 36–319 are shown. Test points 31–35 are connected to test pins 1–5, respectively, in FIG. 1. If test point 33 is connected to one test lead and test points 32, 34 and 35 are connected to the other test lead, then impedances 313–315 will be connected in parallel between these test leads. The parallel impedance of impedances 313–315 can be less than the threshold value $Z_s$ defining a short even though none of these impedances is individually below that threshold. This example represents the worst case for test point 33—namely, test point 33 is connected to one test lead and each of the impedances having one end connected to test point 33 has its other end connected to the other test lead. This situation produces the smallest impedance through test point 33 to one or more other test points.

This observation is utilized to order the test points in a way that reduces the number of tests required to eliminate this type of transient short. For the DC impedance values shown in FIG. 3, the parallel DC impedance at each of the test points for the parallel combination of the impedances connected to that test point is shown in FIG. 5. The test points are ordered in decreasing size of parallel DC impedance by assigning to each test point a test point number such that parallel DC impedance decreases monotonically with increasing test point number. As shown in FIG. 5, the test point number for a test pin need not equal its test pin number. The test pin number is determined by which physical test lead is connected to that test point, but its test point order number is determined by its parallel DC impedance.

The test point numbers are utilized in the test sequence as follows. For a set of N test points, a set of N screening tests are executed. In the kth screening test, test point k is connected to a first test lead 112, all of test points having test point numbers larger than k are connected to a second test lead 112 and then the impedance between the test leads is measured.

For each screening test resulting in a measured impedance below the threshold value $Z_s$, a binary search test sequence is performed to determine which test points are shorted together. In describing this binary search test sequence, phrases like "integral division in half" and "integral division into a first subset and a second subset" will have the following meaning: for a set of test points p to q, an integral division of this set in half is the division of the set into a first subset of test points p to r and a second subset of test points r+1 to q, where r equals (p+q)/2 if p+q is even and equals (p+q−1)/2 if p+q is odd. If the kth screening test indicates the presence of a short, then a binary search test sequence of the set of test points k+1 to N first involves an integral division of this set into a first and a second subset. Next, test point k is connected to the first test lead, the first subset of test points is connected to the second test lead and the impedance between the test leads is measured. After that, the impedance from test point k to the second subset of test points is measured. For either of these two tests indicating the presence of a short, that subset is also subjected to an integral division in half and then the impedance from test point k to each of these new subsets is measured. This procedure of integrally dividing in half any subset that exhibits a short and then measuring the impedance to each of the new subsets is repeated until either the short disappears (i.e., is a transient short) or else the subset contains only a single test point in which case the measured short is not a transient short.

The assignment of test point number in inverse order to associated parallel impedance clusters together in each first subset those test points having greater associated parallel impedances than those in the associated second subset. This increases the odds that each first subset will not exhibit a transient short and therefore increases the odds that each test of a first subset will enable the conclusion that all test point pairs tested for a short in that test can be eliminated from further shorts testing. In a similar manner, the second subset must be tested for shorts in accordance with this method. Similarly, the inclusion of the extra test point in the first subset in those cases in which the set being integrally divided in half has an odd number of test points increases by one the number of test point pairs tested in parallel in the measurement of the impedance to that subset.

We claim:

1. A method of measuring the impedance between a pair of test points of a circuit selected from a class of circuits that can have impedance settling times longer than a minimum repetition time T between a set of successive impedance measurements of one of these circuits, said method comprising the steps of:
   (a) connecting said impedance between a pair of test leads that are connected to a resistance measuring device;
   (b) within a time after step (a) that is smaller than the possible settling time of some devices under test, determining whether an impedance is in an expected resistance range;
   (c) incrementing a parameter N; and
   (d) if the impedance is not in an expected resistance range and if N is within a preselected parameter range between an initial value $N_i$ and a final value $N_f$, then returning to step (b); otherwise
   (e) ending this method;
   wherein $N_f$ is selected to be large enough that, if an unexpected value of the impedance is measured in a final execution of step (d), such final measurement occurs at a time after step (a) that is longer than the longest settling time of the class of devices under test.

2. A method as in claim 1 wherein, in step (d), the return to step (b) occurs at a time long enough after the impedance was connected to the test leads that inductive transients do not produce spurious test results.

3. A method as in claim 1 wherein, in step (d), the return to step (b) occurs at a time long enough after the impedance was connected to the test leads that capacitive transients do not produce spurious test results.

4. A method as in claim 1 wherein N indicates the number of times that step (b) has been executed and the preselected parameter range has limits such that N is outside of the preselected range only after a time sufficient to enable transient responses to die down to a level that does not introduce spurious test results, said method further comprising between steps (d) and (e) the step of: (d') generating an indication that the resistance is not within the expected resistance range.

5. A method as in claim 4 wherein in step (d) if the expected resistance range corresponds to an open, then generating an indication that an expected open was not detected.

6. A method as in claim 4 wherein in step (d) if the expected resistance range corresponds to a short, then generating an indication that an expected short was not detected.

7. A method as in claim 4 wherein in step (d) if the expected resistance range does not correspond to an open but the measured resistance corresponds to an open, then generating an indication that an unexpected open was detected.

8. A method as in claim 4 wherein in step (d) if the expected resistance range does not correspond to a short but the measured resistance corresponds to a short, then generating an indication that an unexpected short was detected.

* * * * *